(12) United States Patent
Grossa et al.

(10) Patent No.: US 6,168,899 B1
(45) Date of Patent: Jan. 2, 2001

(54) MULTIPLE COLOR PROOF TEMPORARY SUPPORTS, PHOTOPOLYMERIZABLE MATERIALS AND PIGMENTED TRANSFER MATERIALS

(75) Inventors: Mario Grossa; Udo Dietrich Bode, both of Dreieich; Manfred Sondergeld, Muhlheim/Main; Karl-Heinz Wiedenmann, Rodermark, all of (DE); Ronald John Convers; Steven Max Kalo, both of Towanda, PA (US); Ashok Kamalaksha Kudva, Hendersonville, NC (US)

(73) Assignee: E. I. du Pont de Nemours and Company, Wilmington, DE (US)

( * ) Notice: Under 35 U.S.C. 154(b), the term of this patent shall be extended for 0 days.

(21) Appl. No.: 08/569,701

(22) Filed: Dec. 7, 1997

(30) Foreign Application Priority Data

Dec. 27, 1994 (DE) ................................ 44 46 870
Dec. 27, 1994 (DE) ................................ 44 46 871
Dec. 27, 1994 (DE) ................................ 44 46 868

(51) Int. Cl.$^7$ ............................................. G03C 1/805
(52) U.S. Cl. .................................... 430/262; 430/293
(58) Field of Search .................... 430/262, 293, 430/281.1

(56) References Cited

U.S. PATENT DOCUMENTS

| | | | |
|---|---|---|---|
| 3,060,025 | 10/1962 | Burg et al. ............................ | 96/28 |
| 3,582,327 | 6/1971 | Boyd et al. ............................ | 96/28 |
| 3,620,726 | 11/1971 | Chu et al. ............................. | 96/27 R |
| 3,649,268 | 3/1972 | Chu et al. ............................. | 96/27 R |
| 4,215,193 | 7/1980 | Manger et al. ....................... | 430/291 |
| 4,243,741 | 1/1981 | Abele et al. .......................... | 430/270 |
| 4,275,140 | 6/1981 | Neiss .................................... | 430/254 |
| 4,291,114 | 9/1981 | Berggren et al. .................... | 430/253 |
| 4,356,253 | 10/1982 | Buzzell ................................. | 430/291 |
| 4,461,823 | 7/1984 | Held ..................................... | 430/120 |
| 4,806,451 | 2/1989 | Frohlich ............................... | 430/291 |
| 4,902,363 | 2/1990 | Delaney et al. ...................... | 156/230 |
| 4,935,331 | 6/1990 | Platzer et al. ........................ | 430/254 |
| 4,939,629 | 7/1990 | Delaney et al. .................. | 428/314.4 |
| 4,948,704 | 8/1990 | Bauer et al. ......................... | 430/291 |
| 5,090,774 | 2/1992 | Dolla ................................... | 296/188 |
| 5,126,226 | 6/1992 | Frohlich et al. ..................... | 430/257 |
| 5,210,001 | 5/1993 | Frohlich et al. ..................... | 430/252 |
| 5,240,810 | 8/1993 | Barjesteh ............................. | 430/257 |
| 5,292,622 | 3/1994 | Metzger et al. ..................... | 430/291 |
| 5,372,910 | 12/1994 | Metzger et al. ..................... | 430/202 |
| 5,380,620 | 1/1995 | Namiki et al. ....................... | 430/257 |

FOREIGN PATENT DOCUMENTS

| | | | | |
|---|---|---|---|---|
| 39 41 493 C1 | 12/1989 | (DE) | ................ | G03F/7/34 |
| 0523325 A1 | 1/1993 | (DE) . | | |
| 614119 A1 | 9/1994 | (EP) . | | |
| 935627 | 9/1963 | (GB) . | | |
| 945807 | 1/1964 | (GB) . | | |
| 95181683 | 7/1921 | (JP) | ................ | G03F/7/105 |
| 96175027 | 7/1979 | (JP) | ................ | G03F/3/10 |
| 5-346662 | 12/1993 | (JP) | ................ | G03F/7/004 |

*Primary Examiner*—Janet Baxter
*Assistant Examiner*—Rosemary Ashton

(57) ABSTRACT

This invention makes available a photopolymerizable material containing at least one polymeric binder, photopolymerizable monomer and, at least one photoinitiator, and having a special shear modulus and a specific thickness. These photopolymerizable materials are used in processes for preparing images, especially multiple color proofs. Temporary supports and pigmented transfer materials specifically designed for the preparation of multiple color proofs are described. A pigmented element having a pigmented transfer layer with a polymeric component of polycaprolactone, polytetrahydrofuran and mixtures thereof is disclosed.

6 Claims, No Drawings

MULTIPLE COLOR PROOF TEMPORARY SUPPORTS, PHOTOPOLYMERIZABLE MATERIALS AND PIGMENTED TRANSFER MATERIALS

FIELD OF THE INVENTION

This invention relates to a photopolymerized material utilized in a process for preparing images, particularly color proofs, whereby a layer having imagewise tacky and non-tacky areas is toned, and the toner adhering to the tacky areas is transferred first onto a temporary support and therefrom to an image receptor. The process utilizing such materials enables the preparation of multiple images and color proofs.

BACKGROUND OF THE INVENTION

Halftone color separations are used in reprography as copy masters for preparing offset or relief printing plates. Before the printing plates are exposed, the color separations are checked in color proofing processes to determine whether the ultimate printing result will be a tonally accurate reproduction of the original. According to general standard specifications, for example, high quality offset printing requires a resolution of 2%–98% dots, even 1%–99% dots on modem printing machines, for a 60 lines/cm screen. It is especially difficult to achieve satisfactory resolution of the small 2% dots in the highlights and 98% dots in the shadows. For good tonal reproduction, it is especially important that dots of the same size be sharply delineated over the entire area and reproduced uniformly, that is, without size variations.

A considerable proportion of these color proofs is supplied by proofing presses, essentially small offset printing presses for the smallest runs. U.S. Pat. No. 5,380,620 discloses a process that uses special, photosensitive, aqueous-developable materials and can be used for color proofing processes. These materials have areas, formed by special auxiliary layers, that accept or repel printing inks, analogous to dry offset plates. Washoff processes have the important disadvantage that waste water containing chemicals must be disposed of, and additional developing processors must be used. U.S. Pat. No. 5,380,620 does mention briefly a material that can be used without aqueous development. However, these offset materials must use very special, fluorine-containing, diazo compounds to make areas that accept or repel printing inks. Tonable photopolymerizable materials are not disclosed.

These are known in other color proofing processes using photosensitive recording materials in which differences in the tackiness of exposed and unexposed areas of the photosensitive layer are used to make the image. German Patent 12 10 321 (UK Patent 945,807), U.S. Pat. Nos. 3,620,726, 3,582,327, 3,649,268, 4,356,253, 4,948,704 and 4,243,741 disclose a reproduction process, wherein a tacky, photopolymerizable, recording material, comprises a support and a photopolymerizable layer containing at least one addition-polymerizable monomer, and a photopolymerization initiator. This recording material is hardened by imagewise exposure, whereupon the exposed image areas lose their tackiness. The latent image is made visible by the application of suitable toners that adhere only to the unexposed tacky areas and can be removed from the exposed nontacky areas. This process yields positive, optionally color images of the original similar in appearance to images produced by the use of printing inks.

The toners, comprising predominantly finely divided powders, can be applied by being dusted on the imagewise exposed surface. According to another embodiment, the toner can also be loosely bonded on a special support and transferred by bringing this support into contact with the imagewise exposed layer. Such transfer layers are significantly more advantageous, because handling is considerably simpler, cleaner, and more friendly to the environment. Color proofing processes using pigmented transfer layers are disclosed in German Patent 12 05 117, 29 49 462, U.S. Pat. Nos. 4,806,451, 4,902,363, 4,939,029, 5,126,226, 5,210,001, 5,090,774, and German Patent 41 20 793, and in U.S. Pat. No. 4,935,331.

However, the cited photographic color proofing processes have the disadvantage that the preparation of multiple copies of the color separations is time-consuming and costly. New photosensitive material must be exposed imagewise and toned to obtain each copy, and multiple photosensitive materials must be processed for polychromatic images. Another disadvantage is that the finished color proofs contain photopolymerized and unphotopolymerized material, which can lead to alterations in colors and changes in dot growth.

U.S. Pat. No. 3,060,025 and EP-C 0 034 816 disclose the preparation of multiple copies of a color separation by transfer of an imagewise color layer onto a receptor. However, these processes also have disadvantages. U.S. Pat. No. 3,060,025 does indeed mention the possibility of making multiple copies by the use of only one photosensitive material, but the final image also contains photosensitive starting material. The process of EP-C 0 034 816 uses toners that become tacky when heated and retain this tackiness a while after cooling, so that a portion of the toner layer can be transferred repeatedly. However, polychromatic images are difficult to prepare this way, because the preceding toner layer is partially transferred back when a new color is applied. Partial transfer of toner layers also alters colors. As contact exposure of the photosensitive material is not possible, because specular images would usually be obtained, the quality required for color proofs cannot be achieved with this process. This problem can be circumvented by the use of temporary supports, as described in U.S. Pat. No. 5,240,810, but the final proof contains additional adhesive layers that affect image quality.

The complex shear moduli of known photopolymerizable layers utilized in proofing applications, for example CROMALIN® 4BX and CROMALIN® 8BX, are outside the range described below.

The problem involved in the invention is to make available multiple, right-reading copies of a color separation or a polychromatic image without using time-consuming and costly processes, while avoiding the indicated disadvantages of known processes, and maintaining constant from the first to the last copy the color locus and resolution required for the color proof.

This problem is solved by providing a photopolymeric layer, a pigmented toning element and a temporary support which are utilized in a process for preparing multiple copies of images.

SUMMARY OF THE INVENTION

The invention provides a photopolymerizable layer, especially for use in color proofing processes, containing at least one polymeric binder, at least one ethylenically unsaturated, photopolymerizable monomer, and at least one photoinitiator, the layer having a thickness of $\geq 10$ µm, wherein the photopolymerizable layer has a complex shear modulus of 170–700 kPa at 25° C., measured in each case at 10 Hz and tau 9750 Pa.

The invention also relates to a pigmented element, for toning a photopolymerizable layer comprising at least one plasticizing component consisting essentially of a support and a pigmented transfer layer, wherein the pigmented transfer layer comprises at least one polymeric component selected from the group consisting of a polymeric binder, a plastizied polymeric binder and mixtures thereof, and wherein the polymeric component is compatible with the at least one plasticizing component of the photopolymerizable layer.

The invention further relates to a temporary support useful in color proofing processes which use a photopolymerizable layer comprising at least one plasticizing component and a pigmented element comprising a pigmented layer on a support, comprising a flexible, dimensionally stable base layer and;

an adhesive layer comprising a 2–5 µm thick coating containing at least one thermoplastic polymer, wherein the coating is compatible with the at least one plasticizing component of the photopolymerizable layer and the pigmented layer, and wherein the coating has a softening temperature of +25 to 130° C.

DETAILED DESCRIPTION OF THE INVENTION

The photopolymerizable layer of the invention and its use in processes for preparing images make it possible to prepare right-reading color proofs, using the advantages of a contact exposure of a tonable, photopolymerizable layer and subsequent transfer of the toner in the image areas without transferring the photopolymerizable layer.

The new photopolymerizable layer enables the preparation of multiple color proofs from only one tonable photopolymerizable layer and by a single exposure for each color, because the properties of the tonable layer are not affected by contact with the pigmented layer and in the transfer of the pigmented image areas onto the temporary support. In particular, the receptivity for toner in the succeeding steps of preparing additional color proofs is not noticeably changed.

The essential components of the photopolymerizable layer of the invention, which has a thickness of $\geq 10$ µm, preferably $\geq 15$ µm, are at least one polymeric binder, at least one ethylenically unsaturated photopolymerizable monomer, and at least one photoinitiator. In addition, the photopolymerizable layers must have a complex shear modulus of 170 to 700 kPa at 25° C. The complex shear modulus is measured at 10 Hz and tau 9750 Pa on a Physica Rheometer MC 120 with an MP 30 measuring unit (see DIN 53018, Part 1, for the geometry). The preferred complex shear modulus is 200–500 kPa at 25° C.

The desired tackiness of the photopolymerizable layers is 8–40 g/cm$^2$, preferably 10–30 g/cm$^2$. It is measured as the separation force for a sensor having an area of 0.9 cm$^2$ and a bearing pressure of 2.5 g for 30 seconds contact time. The optical density of the photopolymerizable layers is usually at least 1.4, preferably 1.4–4.8, especially 2.4 at the maximum sensitivity of the photopolymerizable material, which is usually in the ultraviolet range, preferably in the wavelength range between 250 and 450 nm, especially 360 nm.

The polymeric binders of the photopolymerizable layers can be, for example, the polymers containing crosslinkable, salt-forming groups disclosed in EP-A 0 243 933 (U.S. Pat. Nos. 4,948,704 and 4,243,741). These are preferably polyacrylates containing carboxyl groups, polymethacrylates or copolymers of acrylic acid or methacrylic acid with other monomers, such as, for example, (meth)acrylic acid esters and/or other (meth)acrylic acid derivatives, vinyl compounds, styrene, butadiene, and related monomers. Thermoplastic acrylate and/or methacrylate polymers are preferred, especially copolymers of (meth)acrylic acid and methyl and/or ethyl acrylates or methacrylates.

The carboxyl groups are crosslinked preferably by polyvalent metal compounds of Groups IIA–IVA, IIB–IVB, and VIIB of the Periodic Table, especially zinc compounds. The metal compounds can be added to the photopolymerizable layer, for example, in the form of their salts, oxides, and alkoxides, or as chelates. These compounds are added in quantities such that at least 10% by weight of the salt-forming groups present in the polymeric binder are crosslinked. Admixtures of non-crosslinkable polymers, such as, for example, polyacrylates, polystyrenes, or polyvinyl acetates, can be used to adjust to the desired viscoelastic (shear modulus) range. However, this can also be accomplished by the degree of crosslinking of the polymeric binder through selection of the zinc ion quantity. The quantity of polymeric binder is generally 20–80% by weight, preferably 30–60% by weight, relative to the total mass of the dry layer.

Other components of the polymerizable layers are ethylenically unsaturated monomers and/or plasticizers. The preferred monomers and/or plasticizers have an average molecular weight $M_w$ (weight average) of 200–1000, preferably 200–500. Particularly preferred, ethylenically, unsaturated monomers are polyfunctional monomers of the (meth)acrylate type, such as, for example, trimethylolpropane trimethacrylate, bisacrylates or methacrylates of bisphenol A, pentaerythritol tetramethacrylate. Preferred plasticizers useful in the invention are diffusible plasticizers, for example, glycerol triacetate, di(2-ethyl)-hexylphthalate, or aliphatic oligomeric esters. The quantity of ethylenically unsaturated monomers is generally 10–70% by weight, preferably 20–50% by weight, relative to the total mass of the dry photopolymerizable layer. The quantity of plasticizer is 5–15% by weight.

Useful photopolymerization initiators for the invention's layer can be all compounds known for this purpose. Examples of suitable photoinitiators or photoinitiator systems are benzil dimethylketal, benzoin, benzoin isopropyl ether, alpha-methyl benzoin, 1,4-naphthoquinone, Michler's ketone and benzophenone alone or together, a combination of hexaaryl bisimidazoles and proton donors, such as, for example, mercaptobenzoxazole, and systems of substituted thioxanthones and tertiary amines. Combinations of various initiators are also possible. The concentration of the photoinitiator system is preferably 0.01–15% by weight, relative to the total mass of the dry layer.

In addition to the cited components, the photopolymerizable layers of the invention can contain other additives, such as, for example, sensitizers, fillers, thermal stabilizers, antioxidants, coating aids, and the like. The photopolymerizable layers can be applied onto suitable supports according to known processes from customary solvents, preferably methylene chloride, toluene/methanol mixtures, or other aromatic solvents mixed with alcohols, esters, or ketones, and then dried.

Examples of suitable supports are synthetic resin films of polyethylene, polypropylene, polyamides, or polyesters. Polyethylene terephthalate films are especially preferred, particularly in a thickness $\geq 100$ µm.

Flexible synthetic resin films are used as a cover layer, such as, for example, polyethylene, polypropylene, or polyester films, especially polyethylene tereplithalate films, primarily 6–12.5 µm thick, or polypropylene films, 10–24 µm thick, preferably $\leq 18$ µm.

The preferred pigmented transfer layers are the materials described below. The essential components of these pigmented transfer layers, which are up to 5, preferably less than 3 and especially 0.5–1.5 μm thick, are polymers and/or plasticized polymeric binders compatible with at least one of the plasticizing components of the photopolymerizable layers, that is, with the ethylenically unsaturated monomer(s) and/or one or more plasticizers. Compatibility is determined, for example, by testing the solubility of the binder components of the pigmented transfer layers in the liquid, plasticizing components of the photopolymerizable layer.

These pigmented layers have a glass transition temperature Tg of 10–70° C., preferably 15–35° C. Preferred polymers or oligomers have a low average molecular weight $M_w$ (weight average), preferably $\leq 20,000$, especially 800–5000. Examples of suitable polymers are aromatic hydrocarbon resins. Styrene polymers and copolymers, especially alpha-methyl styrene/styrene copolymers and alpha-methyl styrene/vinyl toluene copolymers are preferred.

Pigmented transfer layers containing a polymer having 10–50% crystallinity are advantageous. These polymers have preferably a melting point of 25–60° C. and an average molecular weight $M_w$ (weight average) of 1000–50,000. Examples of such polymers are polyether glycols and polyester glycols. Polycaprolactone and polytetrahydrofuran are particularly useful. The pigmented transfer layers can contain $\geq 15\%$ by weight of finely divided powders or the combination of finely divided powder/dissolved dye, preferably 15–50% by weight. Many finely divided powders suitable for image recording are disclosed in the prior art, for example, U.S. Pat. Nos. 3,582,327 and 4,215,193. These powders are predominantly pigments, but dissolved dyes combined with a finely divided powder are also useful. Examples are inorganic and organic pigments, fluorescent materials, metal powder in pure form or together with an organic or inorganic carrier powder, such as, for example, titanium dioxide, powdered glass, carbon (carbon black or graphite), metal phthalocyanines, azo dyes, powdered aluminum, copper, iron, gold, or silver or metal oxides.

In addition to the aforesaid components, the pigmented transfer layers can contain other additives, such as surfactants, casting aids, slip agents, agents to increase viscosity, agents for adhesion control, and the like.

Suitable supports for the pigmented transfer layers are transparent and opaque synthetic resin films of polyesters, polyamides, polyethylene, polypropylene, polyvinyl chloride, and the like. Especially advantageous are compressible materials, such as described in U.S. Pat. Nos. 4,902,363 and 4,939,029, especially foamed polypropylene films.

The materials described below are used as temporary supports. These comprise a flexible, dimensionally stable, support film, preferably polyethylene terephthalate film 75–175 μm thick, especially 100 μm thick, and a 0.5–5 μm, preferably 0.5–3 μm thick coating of at least one thermoplastic polymer. This coating which forms an adhesive layer is compatible with at least one of the plasticizing components of the photopolymerizable layers and/or the pigmented layers and has a softening temperature of +25 to +130° C., preferably +30 to +110° C. Compatibility can be determined, for example, from the solubility parameters of the individual compounds by separate solubility tests or by the effect, measured separately, of added plasticizing components on the glass transition temperatures of the binders. The softening temperature of the coating material can be adjusted by polymers having an appropriate softening temperature or by plasticized polymers.

Polymers and copolymers of (meth)acrylates or styrene polymers and copolymers, among others, can be used. Suitable plasticizers, preferably having an average molecular weight $M_w$ (weight average) of 800–6000, especially up to 2000, are, for example, di(tridecyl) phthalate and polymeric plasticizers, such as, for example, polyesters of glycols and aliphatic carboxylic acids, such as adipic acid and glutaric acid, or polyacrylates.

An optional interlayer or release layer, 1–15 μm thick, preferably 2–10 μm thick, and preferably of acrylic acid copolymers, especially copolymers of acrylic acid and ethylene, can be present between the dimensionally stable support film and the coating material. Known materials, especially silica, are suitable as matte agents and a matte interlayer is especially preferred. A special advantage provided by the matte layers is that the final proof has a matte surface without additional, color altering layers being transferred onto the paper.

The temporary support contains at least one thermoplastic adhesive layer upon a flat, dimensionally stable film base, e.g., poly(ethylene terephthalate). Some useful film bases include Mylar® 400D polyester film (DuPont), 3 mil Mylar® EB-11 polyester film (DuPont), etc. The adhesive layer may transfer to paper with the multicolor image. Gloss of the transferred image on paper may be matched to the paper gloss by embossing a rough surface to the outer surface of the adhesive layer on paper. This embossing can be done by coating the adhesive layer onto a matte film base.

The transfer of the multicolor image to paper can be facilitated by modifying the adhesion of the adhesive layer to the film base. The adhesion may be modified by appropriately changing the surface of the film. One way to change the surface of the film base would include coating it with a "release" layer which adheres well to the film base, but which adheres to the adhesive layer less strongly than the original film base did. This approach allows for the use of a matting agent, e.g., silica, as an ingredient of the release layer to emboss the adhesive layer. The silica in this case unexpectedly eliminates a defect, namely poor "overprintability" which is the incomplete transfer of ink from the master to the already colored regions of a colored temporary support.

Tackifying resins incorporated into the adhesive layers can facilitate image transfer to paper, although those resins show no useful performance as adhesive layers by themselves.

The temporary supports' thermoplastic polymer comprises:
(a) poly (n-butyl methacrylate); or
(b) poly (isobutyl methacrylate); or
(c) styrene-butadiene copolymer; or
(d) a blend of poly (n-butyl methacrylate) and an aromatic hydrocarbon resin in a ratio by weight of 1:100 to 100:1; or
(e) a blend of styrene-butadiene copolymer and polystyrene resin in a ratio by weight of 1:100 to 100:1; or combinations thereof.

The temporary support further comprises a release layer between the base layer and the adhesive layer wherein the release layer comprises:
(a) a blend of a maleic acid-methyl vinyl ether copolymer; poly (vinyl alcohol) and a maleic acid neutralizing amine wherein the ratio of maleic acid-methyl vinyl ether to poly (vinyl alcohol) ranges from 1:100 to 100:1; or (b) a blend of a polyamide resin and a silica matting agent in a ratio by relative weight of 1000:1 to 9:1.

PROCESS OF USE

The process for preparing multiple color proofs is described below and includes the following steps:
   a) producing tacky and nontacky areas on a photopolymerizable layer (A) by imagewise exposure,
   b) bringing the exposed Layer (A) into contact with a pigmented transfer layer (B) on a support (C),
   c) peeling off the support (C), whereupon the pigmented transfer layer (B) is transferred onto the tacky areas of the exposed layer (A) and is removed from the nontacky areas of the exposed layer (A),
   d) bringing the toned layer (A) into contact with the temporary support (D) of this invention,
   e) removing the temporary support (D), whereupon the pigmented transfer layer (B) adhering on the tacky areas of the toned layer (A) is transferred onto the temporary support (D),
   f) bringing the temporary support (D) into contact with an image receptor (E),
   g) removing the temporary support (D), whereupon the pigmented transfer layer (B) adhering on the temporary support is transferred onto the image receptor (E), and
   h) repeating steps b) through g) at least once, whereby, in each instance, a new pigmented transfer layer (B), a new temporary support (D), and a new image receptor are used.

For the preparation of multiple color proofs in the above-described process, the following steps are performed after step e):
   i) repeating steps b) to e) at least once, using in each case a new pigmented transfer layer (B) and a new temporary support (D),
   j) repeating steps a) to e) and i) at least once, using in each case a new photopolymerizable layer (A), a new pigmented transfer layer (B), and the temporary supports D toned in the preceding steps,
   k) bringing the temporary supports D in contact with an image receptor (E), and
   l) removing the temporary supports D, whereupon the pigmented transfer layers B adhering on the temporary supports are transferred onto the image receptors E.

A variation of this process for making multiple color images provides for the following steps after step e) of the monochromatic process:
   m) repeating steps a) to e) at least once, using in each case a new photopolymerizable layer (A), a new pigmented transfer layer (B), and the temporary support (D) toned in the preceding steps,
   n) bringing the temporary support (D) into contact with an image receptor (E),
   o) removing the temporary support (D), whereupon the pigmented transfer materials B adhering on the temporary support are transferred onto the image receptor (E), and
   p) repeating steps b) to e), m) to o) at least once, using a new photopolymerizable layer (A) in step m), new pigmented transfer materials B in steps b) and m), a new temporary support (D) in step d), and a new image receptor (E) in step n).

For the preparation of the imagewise tacky and nontacky areas, the invention's photopolymerizable layers are exposed through the transparent cover film with a color separation positive by a suitable radiation source, such as, for example, xenon lamps, mercury vapor lamps, and lasers.

After the cover film is removed, a pigmented transfer layer is applied and its support is peeled off manually after a holding time of 5–50 s, preferably 10–20 s, at a velocity of about 50 m/s, with the untransferred areas. These process steps are usually conducted at low temperature, that is, below 50° C., preferably below 30° C., especially at 22° C., between two rotating cylinders in a laminator. Usually immediately after its application, the pigmented transfer layer is peeled off at a high separation velocity, preferably at 10–50 cm/s, most preferably at 10–30 cm/s. The separation velocity is the velocity at which the separation line of the two layers travels.

The imagewise toned layers of the invention are brought into contact with the temporary supports (D) at an elevated temperature, preferably at $\leq 60°$ C. and preferably in a laminator. The materials are usually separated immediately, and preferably at a low separation velocity, preferably at 2–5 cm/s.

The transfer of the images from the temporary support onto the final support, preferably paper, is accomplished preferably in a laminator at elevated temperature, preferably 60–90° C. The paper is usually separated at a velocity of 5–30 cm/s. The paper can be any known printing paper.

The process of the invention and materials make it possible to assure the quality required for color proofing in at least five proofs within process times and conditions that can be acceptably maintained in practice. This invention is especially suitable for use in a process, wherein lamination and delamination of tonable layers, of pigmented transfer layers, and of temporary supports to transfer colored image areas take place through rotating cylinders at a velocity of 1–30 cm/s and at a temperature between 20 and 60° C.

The following examples illustrate this invention in more detail without being limited thereto. Parts and percentages, unless otherwise stated, are by weight.

EXAMPLES

Example 1

The following materials were prepared and processed for the preparation of five 4-color proofs:

A coating solution having the following composition in toluene/methanol was applied onto a 50 μm polyethylene terephthalate film so as to yield, after drying, a 12 μm thick photopolymerizable film having a complex shear modulus of 206 kPa. An 18 μm thick, transparent cover sheet was laminated on the film.

| INGREDIENTS | % BY WEIGHT |
| --- | --- |
| Ethyl acrylate/acrylic acid copolymer (92/8), $M_W$ = 7000, $T_g$ = −14° C. | 5.0 |
| Ethyl acrylate/methyl methacrylate/acrylic acid copolymer (56/37/7), $M_W$ = 150,000, $T_g$ = +34° C. | 13.0 |
| Ethyl acrylate/methyl methacrylate/acrylic acid copolymer (17/71/12) $M_W$ = 200,000, $T_g$ = +70° C. | 22.0 |

-continued

| INGREDIENTS | % BY WEIGHT |
|---|---|
| Diacrylate ester of a bisphenol A epoxy resin, (viscosity = 1,000,000 cps) | 9.48 |
| Glycerol triacetate | 9.0 |
| Trimethylol propane | 5.5 |
| Stabilizer: hydroquinone monomethyl ester | 0.02 |
| Initiator system: 2-chlorophenyl-4,5-bis(phenyl)-imidazoyl dimer and 2-mercaptobenzoxazole | 2.75 |
| Trimethylol propane trimethacrylate | 23.0 |
| Polycaprolactone, $M_w$ = 10,000 | 0.25 |
| Zinc acetylacetonate | 4.0 |
| Ethyl Michler's ketone | 2.0 |
| Polyoxyethylene(4)-lauryl ether | 4.0 |

Each of the following coating solutions in toluene was applied onto a 60 μm thick polypropylene foam film, so as to yield, after drying, a 1 μm thick, pigmented, transfer layer.

Coating Solution for Cyan Pigment Layer:

| INGREDIENTS | % BY WEIGHT |
|---|---|
| Alpha-methyl styrene/styrene copolymer, $M_w$ = 1200 | 53.25 |
| Polytetrahydrofuran, $M_w$ = 1000 | 13.32 |
| Pigment blue 15; C.I. 74160 | 28.89 |
| Dispersing agent: Disperbyk 163 (BYK Chemie) | 4.27 |

Coating Solution for Magenta Pigment Layer:

| INGREDIENTS | % BY WEIGHT |
|---|---|
| Alpha-methyl styrene/styrene copolymer, $M_w$ = 1200 | 34.77 |
| Polytetrahydrofuran, $M_w$ = 1000 | 10.83 |
| Dicyclohexyl phthalate | 5.46 |
| Coating aid: ethyl cellulose EC/T350 (Hercules) | 2.68 |
| Pigment red 57; C.I. 15850/pigment red 184; C.I. 12487 | 40.23 |
| Dispersing agent: Disperbyk 163 (BYK Chemie) | 6.03 |

Coating Solution for Yellow Pigment Layer:

| INGREDIENTS | % BY WEIGHT |
|---|---|
| Alpha-methyl styrene/styrene copolymer, $M_w$ = 1200 | 43.23 |
| Polytetrahydrofuran, $M_w$ = 1000 | 13.39 |
| Dicyclohexyl phthalate | 6.69 |
| Coating aid: ethyl cellulose EC/T350 (Hercules) | 3.35 |
| Pigment yellow 13; C.I. 21100/Pigment Yellow 83; C.I. 21108 | 28.98 |
| Dispersing agent: Disperbyk 163 (BYK Chemie) | 4.35 |

Coating Solution for Black Pigment Layer:

| INGREDIENTS | % BY WEIGHT |
|---|---|
| Alpha-methyl styrene/styrene copolymer, $M_w$ = 1200 | 29.27 |
| Polytetrahydrofuran, $M_w$ = 1000 | 9.07 |
| Dicyclohexyl phthalate | 4.53 |
| Coating aid: ethyl cellulose EC/T350 (Hercules) | 2.27 |
| Pigment black 7; C.I. 77266 | 47.70 |
| Dispersing agent: Disperbyk 163 (BYK Chemie) | 7.15 |

For the preparation of a temporary support, a 1.5 μm thick layer of Elvax® 420 (DuPont, ethylene/vinyl acetate copolymer, 18% vinyl acetate, softening temperature 99° C., ASTM E 28) was coated onto a 100 μm thick polyethylene terephthalate film and dried. In addition, the following materials were utilized to prepare temporary supports with and without an optional interlayer (release layer).

Some useful adhesive layers which were prepared are shown in the following table:

| ADHESIVE LAYER # | INGREDIENTS | AMOUNT (%) |
|---|---|---|
| 1 | Poly (n-butyl methacrylate) | 100 |
| 2 | Poly (isobutyl methacrylate) | 100 |
| 3 | Stereon ® 881 (styrene-butadiene copolymer), Bridgestone/Firestone, Inc., Akron, OH | 100 |
| 4 | Poly (n-butyl methacrylate) | 60 |
|   | Kristalex ® 3085 synthetic aromatic hydrocarbon resin, Hercules, Inc., Wilmington, DE | 40 |
| 5 | Poly (n-butyl methacrylate) | 60 |
|   | Piccolastic ® A5 hydrocarbon resin, Hercules, Inc., Wilmington, DE | 40 |

When the adhesive layer is poly (n-butyl methacrylate) or poly (isobutyl methacrylate), a release layer may be present on the polyethylene terephthalate base. Some useful release layers are listed in the following table:

| RELEASE LAYER # | INGREDIENTS | AMOUNT (%) |
|---|---|---|
| 1 | Gantrez ® 97 maleic acid - methyl vinyl ether Copolymer, ISP Technologies, Inc., Wayne, NJ | 38 |
|   | Elvanol ® 52-22 polyvinyl alcohol resin, DuPont, Wilmington, DE | 39 |
|   | Dimethylethanoiamine | 23 |
| 2 | Uni-Rez ® polyamide resin, Union Camp, Inc., | 95 |
|   | Syloid ® ED-2, W. R. Grace Co., New York, NY | 5 |

The percentage of dimethyl ethanolamine or equivalent neutralizing amine is varied to enable neutralization of the acid component of the maleic acid-methyl vinyl ether copolymer. The relative percentage of the individual resins in the polymeric blends of the release layers may be varied. The amount of silica added to the release layer composition may also vary as long as the essential or desirable features of the release layer are not disrupted.

Example 2

The following materials were prepared and processed for the preparation of multiple proofs:

A coating solution having the following composition in toluene/methanol was applied onto a 50 mm polyethylene terephthalate film, so as to yield, after drying, a 12 μm thick photopolymerizable film. An 18 μm thick, transparent cover sheet was laminated on the film. The molecular weights and Tg's are similar to those in Example 1.

| INGREDIENTS | % BY WEIGHT |
|---|---|
| Ethyl acrylate/acrylic acid copolymer (92/8) $M_W$ = 7000 | 3.07 |
| Ethyl acrylate/methyl methacrylate/acrylic acid copolymer (56/37/7), $M_W$ = 150,000 | 12.67 |
| Ethyl acrylate/methyl methacrylate/acrylic acid copolymer (17/71/12) $M_W$ = 200,000 | 22.30 |
| Diacrylate ester of Bisphenol A epoxy resin (viscosity 1,000,000 cps) | 9.61 |
| Glycerol triacetate | 9.40 |
| Trimethylol propane | 7.70 |
| Hydroquinone monomethyl ether | 0.02 |
| p-(dimethylamino)-benzoic acid ethyl ester | 1.72 |
| 2-mercaptobenzoxazole | 0.81 |
| 7-(4-chloro-6-(diethylamino)-1,3,5-triazin-2-yl)-amino-3-phenyl 1-H benzopyran-2-on | 1.52 |
| Trimethylol propane trimethacrylate | 23.31 |
| Zinc acetylacetonate | 4.05 |
| Polyoxyethylene (4)-lauryl ether | 2.00 |

The following coating solutions in toluene/ethyl acetate (80/20) was applied (Cyan) or may be applied (other colors) onto a 60 μm thick polypropylene foam film, so as to yield, after drying, a 1 μm thick pigmented transfer layer.

| Coating Solution for Cyan Pigment Layer: | |
|---|---|
| INGREDIENTS | % BY WEIGHT |
| Kristalex ® F100 | 50.03 |
| Polytetrahydrofuran | 9.01 |
| Dicyclohexylphthalate | 4.98 |
| Ethyl cellulose EC/T350 | 4.03 |
| Cyan pigment | 24.38 |
| Disperbyk 163 | 4.92 |
| Aerosil ® R972 | 2.65 |

The above ingredients were added in 20% by weight to a toluene/ethyl acetate (80/20) solution to form the coating solution. The remaining pigmented transfer foils may also be prepared analogously to form the four pigmented transfer layers.

For the preparation of a temporary support (transfer sheet) used in the process disclosed herein, the adhesive layer comprised a 1 micron layer of Elvacite® 2046 (1:1 mixture of poly(n-butyl methacrylate) and poly(isobutyl methacrylate) and the release layer comprised Uni-Rez® 2654 with 5% (by weight) of Syloid® ED-2.

When processed according to the process described below, Example 2 parallels that described for Example 1 except the pigmented foils using the ingredients and elements in Example 2 are not immediately peeled off the master film (photopolymerizable film) but are peeled off by hand after a holding time of about 10–20 s. In addition, with Example 2 ingredients and elements, the transfer sheet is peeled off manually.

Process of Use

The tonable, photopolymerizable layer was exposed for 42 seconds through a halftone, positive, cyan color separation in a vacuum copying frame with a metal halide lamp (1000 watts) having an ultraviolet filter at a distance of 95 cm. After the cover film was removed, the cyan transfer layer was laminated at room temperature on the imagewise exposed layer and immediately peeled off at about 20 cm/s. The pigmented transfer layer was completely transferred onto the tacky areas without residues on the nontacky areas. The toned layer was then laminated at about 50° C. on a temporary support and immediately peeled off at about 5 cm/s. The pigmented image areas were completely transferred onto the temporary support. The toning of the imagewise exposed layer with new cyan transfer layers and the subsequent transfer of the image areas onto new temporary supports was repeated four times. These process steps were repeated for the magenta, yellow, and black colors. The temporary supports, each bearing a 4-color image, were laminated at 80° C. onto printing papers and after cooling were peeled off at about 10 cm/s. All of the 4-color proofs, from the first to the last, had the required constant quality without changes in resolution or density.

What is claimed is:

1. A pigmented element, for toning a photopolymerizable layer comprising at least one plasticizing component, consisting essentially of a support and a pigmented transfer layer, wherein the pigmented transfer layer comprises at least one polymeric component selected from the group consisting of polycaprolactone, polytetrahydrofuran and mixtures thereof, and wherein the polymeric component is compatible with the at least one plasticizing component of the photopolymerizable layer.

2. The pigmented element according to claim 1, wherein the pigmented transfer layer has a glass transition temperature of 10–70° C.

3. The pigmented transfer layer according to claim 1 wherein the polymeric component has an average molecular weight $M_w$ of $\leq 20,000$.

4. The pigmented transfer layer according to claim 1 wherein the polymeric component has a 10 to 50% crystallinity.

5. The pigmented transfer layer according to claim 1 wherein the polymeric component has a melting point of 25–60° C.

6. The pigmented element of claim 1 wherein the pigmented transfer layer further comprises a placticizing component.

* * * * *